United States Patent
Xia et al.

(10) Patent No.: US 7,511,472 B1
(45) Date of Patent: Mar. 31, 2009

(54) POWER MEASURING APPARATUS

(75) Inventors: Chun-Hua Xia, Shanghai (CN);
Li-Hong Huang, Nan Jing (CN);
Shih-Hao Liu, Taoyuan County (CN)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/969,678

(22) Filed: Jan. 4, 2008

(30) Foreign Application Priority Data

Nov. 19, 2007 (TW) ............................... 96143770 A

(51) Int. Cl.
G01R 7/00 (2006.01)
G01R 11/32 (2006.01)
G05F 1/00 (2006.01)
H02M 5/42 (2006.01)
H02M 7/68 (2006.01)
H02M 3/24 (2006.01)
H02M 7/44 (2006.01)

(52) U.S. Cl. ........................ 324/142; 323/282; 363/97

(58) Field of Classification Search ........................ None
See application file for complete search history.

(56) References Cited

U.S. PATENT DOCUMENTS 5,932,994 A * 8/1999 Jo et al. ...................... 323/222
5,982,160 A * 11/1999 Walters et al. ............... 323/282
6,219,262 B1 * 4/2001 Burgyan ....................... 363/97
6,943,538 B2 * 9/2005 Choi .......................... 324/142

FOREIGN PATENT DOCUMENTS

TW 200703116 1/2007

* cited by examiner

Primary Examiner—Ha Tran T Nguyen
Assistant Examiner—Roberto Velez
(74) Attorney, Agent, or Firm—J.C. Patents

(57) ABSTRACT

A power measuring apparatus including a voltage transformer, a voltage-current measuring circuit, and an operation unit is provided. The voltage transformer converts an input voltage signal into an output voltage signal. The voltage-current measuring circuit includes an inductor, a first resistor, a first capacitor and a second capacitor. A first end of the first inductor herein receives the output voltage signal and a second end thereof generates a voltage feedback signal. The operation unit performs an operation on the voltage feedback signal and a terminal current signal between the first terminal and the second terminal of the first capacitor so as to calculate a power signal. In this way, the accuracy of thermal test is effectively increased by the presented invention.

6 Claims, 2 Drawing Sheets

POWER MEASURING APPARATUS

CROSS-REFERENCE TO RELATED APPLICATION

This application claims the priority benefit of Taiwan application serial no. 96143770, filed on Nov. 19, 2007. The entirety of the above-mentioned patent application is hereby incorporated by reference herein and made a part of this specification.

BACKGROUND OF THE INVENTION

1. Field of the Invention

The present invention generally relates to a power measuring apparatus, and more particularly, to a power measuring apparatus capable of increasing the accuracy of thermal test.

2. Description of Related Art

In a computer system or a server today, the center processing unit (CPU) thereof has increasing operation efficiency and operation frequency. In order to assure the stability of a computer system or server, conducting thermal test is a routine procedure, wherein a key point of the thermal test is to measure the power thereof as the CPU or the chipset runs in the maximum power.

However, during conducting thermal test in a computer system or a server, the power of the CPU or the chipset is usually obtained by measuring the input current of the CPU or the server, followed by calculating and converting the measured input current into an input current at the output terminal thereof. Therefore, the above-mentioned measurement is an indirect and rough way. In particular, the variations of the operation efficiency of the computer system or the server and the voltage identification code signal (VID signal) are hard to control, thus, the uncertainty of power measurement is further increased, which results in a low efficiency of thermal test.

SUMMARY OF THE INVENTION

Accordingly, the present invention is directed to a power measuring apparatus, which is able to instantly measure the power of a CPU and each chipset so as to promote the working efficiency and quality and increase the accuracy of thermal test.

The present invention provides a power measuring apparatus, which includes a voltage transformer, a voltage-current measuring circuit and an operation unit. The voltage transformer is employed to convert an input voltage signal into an output voltage signal and includes a pulse width modulation unit (PWM unit) and a switch unit, wherein the PWM unit generates a PWM signal according to a voltage feedback signal; and the switch unit is coupled to the PWM unit and decides whether or not to turn on a switch thereof to output the input voltage signal as an output voltage signal according to the PWM signal.

The voltage-current measuring circuit includes an inductor, a first resistor, a first capacitor and a second capacitor. The first end of the inductor receives the output voltage signal and the second end thereof generates the voltage feedback signal. The first end of the first resistor is coupled to the first end of the inductor. The first terminal of the first capacitor is coupled to the second end of the first resistor and the second terminal thereof is coupled to the second end of the inductor. The first terminal of the second capacitor is coupled to the second end of the inductor and the second terminal thereof is coupled to a ground terminal. The operation unit is employed for operating on the voltage feedback signal and a terminal current signal between the first terminal and the second terminal of the first capacitor so as to obtain a power signal by calculating.

In an embodiment of the present invention, the above-mentioned PWM unit includes an error amplifier and a comparator. The error amplifier is employed for comparing the voltage feedback signal with a voltage reference signal and generating the error signal. The comparator is employed for comparing the error signal with a ramp signal and generating a PWM signal.

In an embodiment of the present invention, the above-mentioned switch unit includes a first transistor and a second transistor, wherein the gate of the first transistor receives the PWM signal, the first source/drain terminal thereof receives the input voltage signal and the second source/drain terminal thereof generates the output voltage signal; the gate of the second transistor receives the PWM signal, the first source/drain terminal thereof is coupled to the second source/drain terminal of the first transistor and the second source/drain terminal thereof is coupled to the ground terminal.

In an embodiment of the present invention, the above-mentioned operation unit includes a current amplifier, a voltage amplifier, a first analog-to-digital converter (ADC), a first multiplier, a second ADC and a second multiplier. The current amplifier has a first terminal and a second terminal respectively coupled to the first terminal and the second terminal of the first capacitor for converting a terminal current signal into a one-phase current signal. The voltage amplifier has a first terminal for receiving the voltage feedback signal and a second terminal thereof is coupled to the ground terminal to gain the voltage feedback signal. The first ADC converts the one-phase current signal into a digital current signal. The first multiplier multiplies the digital current amplifier by a number to generate a total output current signal. The second ADC converts the gained voltage feedback signal into a digital voltage signal. The second multiplier multiplies the total output current signal by the digital voltage signal to obtain the power signal.

In an embodiment of the present invention, the above-mentioned power measuring apparatus further includes a measuring module and a third ADC. The measuring module is coupled to the first terminal and the second terminal of the first capacitor, so as to measure a voltage across the first terminal and the second terminal of the first capacitor to obtain the terminal current signal, wherein the measuring module includes a plurality of first switches, a plurality of second switches, a plurality of second resistors and a plurality of third capacitors. The first terminals of the above-mentioned first switches are coupled to the first terminal of the first capacitor; the first terminals of the above-mentioned second switches are coupled to the second terminal of the first capacitor; the first ends of the above-mentioned second resistors are respectively coupled to the second terminals of the above-mentioned first switches, the second ends thereof are coupled to each other and the above-mentioned second resistors have different resistances; the first terminals of the above-mentioned third capacitors are respectively coupled to the second terminals of the above-mentioned second switches, the second terminals thereof are respectively coupled to the second ends of the above-mentioned second resistors and the above-mentioned third capacitors have different capacitances. The third ADC is coupled to the first terminals of the above-mentioned second switches and second ends of the above-mentioned second resistors to convert the terminal current signal into a digital current signal, wherein on and off state of the above-mentioned first switches and second switches cause the above-mentioned second resistors and third capacitors have different combinations so as to enable the measuring module to measure the terminal current signal in different current ranges.

In an embodiment of the present invention, the above-mentioned operation unit is a baseboard management controller (BMC) to conduct operations on the voltage feedback signal and the digital current signal for obtaining the power signal. In another embodiment, the above-mentioned power measuring apparatus further includes a display coupled to the output terminal of the operation unit for displaying the amount of the power signal.

In summary, the present invention uses a voltage-current measuring device to convert the output voltage signal generated by a power converter into a voltage feedback signal. Further, a terminal current signal is obtained by measuring the voltage across the terminals of the first capacitor. Moreover, an operation unit is used to conduct operations on the voltage feedback signal and the terminal current signal so as to obtain the measured power. According to the measurement scheme of the present invention, variations of the voltage feedback signal and the terminal current signal can instantaneously affect the output of the operation unit, which enables to increase the accuracy of power measurement and advance the operation efficiency and quality of thermal test.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
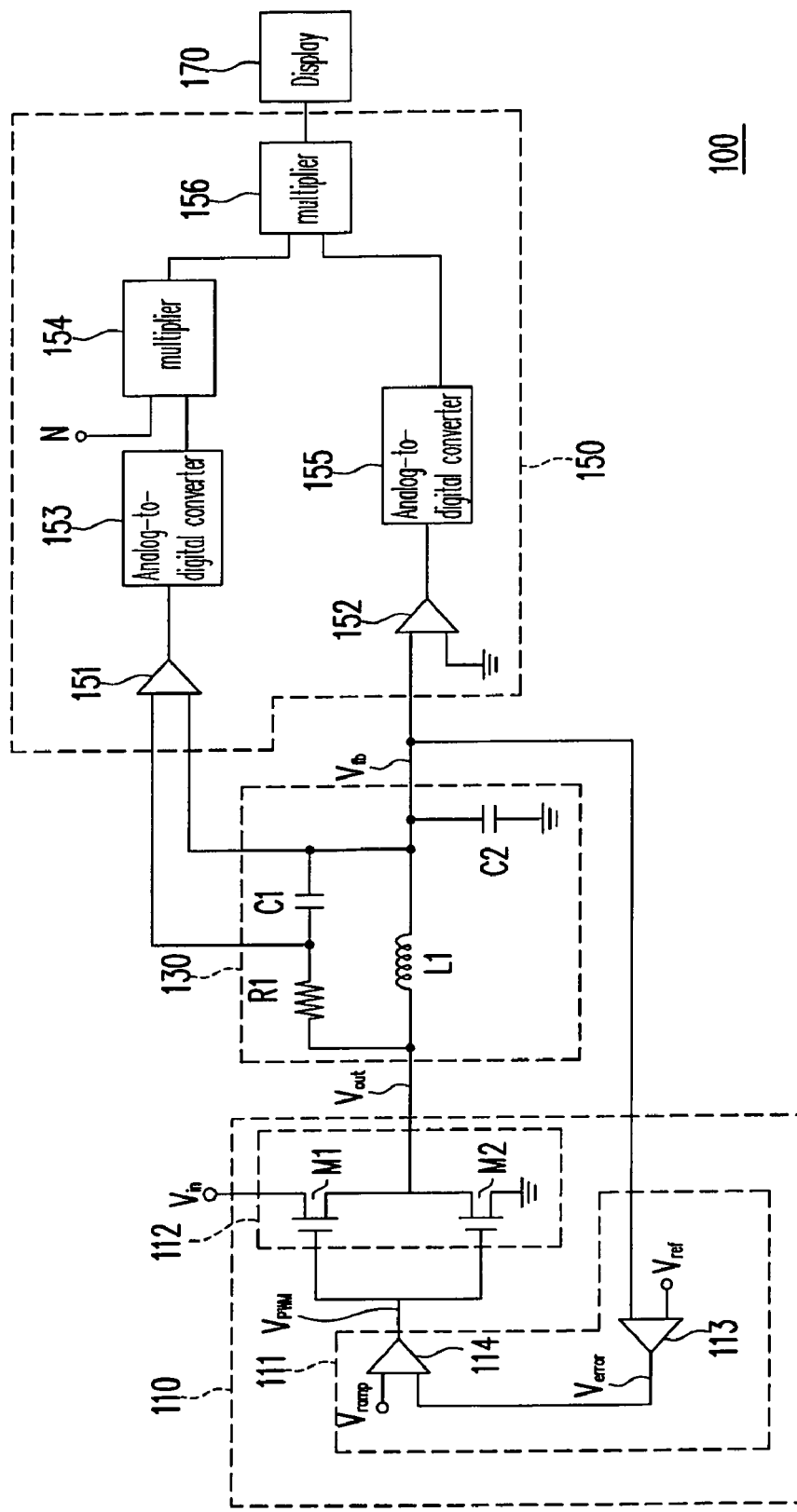
FIG. 1 is a circuit diagram of a power measuring apparatus according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a circuit diagram of a power measuring apparatus according to an embodiment of the present invention. Referring to FIG. 1, a power measuring apparatus 100 includes a voltage transformer 110, a voltage-current measuring circuit 130, an operation unit 150 and a display 170.

The voltage transformer 110 includes a PWM unit 111 and a switch unit 112, wherein the PWM unit 111 includes an error amplifier 113 and a comparator 114. The error amplifier 113 receives a voltage feedback signal $V_{fb}$ and compares the voltage feedback signal $V_{fb}$ with a voltage reference signal $V_{ref}$ to generate an error signal $V_{error}$ output to the comparator 114. The comparator 114 receives the error signal $V_{error}$ and compares the error signal $V_{error}$ with a ramp signal $V_{ramp}$ to generate a PWM signal $V_{PWM}$ output to the switch unit 112 for controlling on/off state of the switch unit 112.

The switch unit 112 includes transistors M1 and M2. The gate of the transistor M1 receives the PWM signal $V_{PWM}$, the first source/drain terminal thereof receives an input voltage signal $V_{in}$ and the second source/drain terminal thereof generates an output voltage signal $V_{out}$. The gate of the transistor M2 receives the PWM signal $V_{PWM}$, the first source/drain terminal thereof is coupled to the second source/drain terminal of the transistor M1 and the second source/drain terminal thereof is coupled to a ground terminal. In the embodiment, the transistors M1 and M2 are not simultaneously turned on or off. That is, when the transistor M1 is turned on, the transistor M2 is turned off; when the transistor M1 is turned off, the transistor M2 is turned on.

The voltage-current measuring circuit 130 includes an inductor L1, a resistor R1 and capacitors C1 and C2. The first end of the inductor L1 receives the output voltage signal $V_{out}$ and the second end thereof generates the voltage feedback signal $V_{fb}$. The first end of the resistor R1 is coupled to the first end of the inductor L1. The first terminal of the capacitor C1 is coupled to the second end of the resistor R1 and the second terminal thereof is coupled to the second end of the inductor L1; the first terminal of the capacitor C2 is coupled to the second end of the inductor L1 and the second terminal thereof is coupled to the ground terminal.

The operation unit 150 includes a current amplifier 151, a voltage amplifier 152, ADCs 153 and 155 and multipliers 154 and 156. The current amplifier 151 has a first terminal and a second terminal respectively coupled to the first and second terminals of the capacitor C1 for converting the terminal current signal into a one-phase current signal. The voltage amplifier 152 has a first terminal to receive the voltage feedback signal $V_{fb}$ and the second terminal thereof is coupled to the ground terminal. The voltage amplifier 152 is to gain the voltage feedback signal $V_{fb}$.

The ADC 153 converts the one-phase current signal into the digital current signal. The multiplier 154 multiplies the digital current signal by a number N to generate a total output current signal, wherein the number N is, for example, a constant. The ADC 155 converts the gained voltage feedback signal $V_{fb}$ into a digital voltage signal. The multiplier 156 multiples the total output current signal by the digital voltage signal to obtain the power signal.

Continuing to refer FIG. 1, in the voltage-current measuring circuit 130, the resistor R1 and the capacitor C1 both in series connection would be connected in parallel to the inductor L1 to establish a Kelvin connection and further to form a complete Kelvin circuit, wherein since the resistor R1 and the capacitor C1 are coupled to the inductor L1 in Kelvin connection form, therefore, the voltage-current measuring circuit 130 is able to accurately measure the current variation of the inductor L1, and the current variation can be reflected by the voltage variation on the capacitor C1.

In short, a one-phase current signal is obtained by inputting the voltage across the terminals of the capacitor C1 to the current amplifier 151. Next, the one-phase current signal is converted into the digital current signal by the ADC 153 and the obtained digital current signal is multiplied by a number N (for example, the phase number) by the multiplier 154 so as to obtain a total current signal corresponding to the total output current of, for example, the CPU or the chipset.

On the other hand, the inductor L1 and the capacitor C2 form a complete low-pass filter for filtering the high-frequency component in the output voltage signal $V_{out}$ and generating the voltage feedback signal $V_{fb}$. After that, the voltage amplifier 152 gains the voltage feedback signal $V_{fb}$ generated at the second end of the inductor L1, and then, the ADC 155 converts the gained voltage feedback signal $V_{fb}$ into the digital voltage signal.

After the multiplier 156 receives the digital voltage signal and the total current signal, the above-mentioned two signals are multiplied by each other to calculate a power signal, which just represents the power of the CPU or the chipset. The power signal is sent to the display 170 so as to directly display the amount of the power signal, and a user then can be aware of the power information of the CPU or the chipset through the display 170. If the terminal current signal on the capacitor C1 and the voltage feedback signal $V_{fb}$ have variations, the variation of the power signal can be instantaneously monitored on the display 170, which increases the accuracy of thermal test and advances the operation efficiency and quality of the test.

Figure 2:
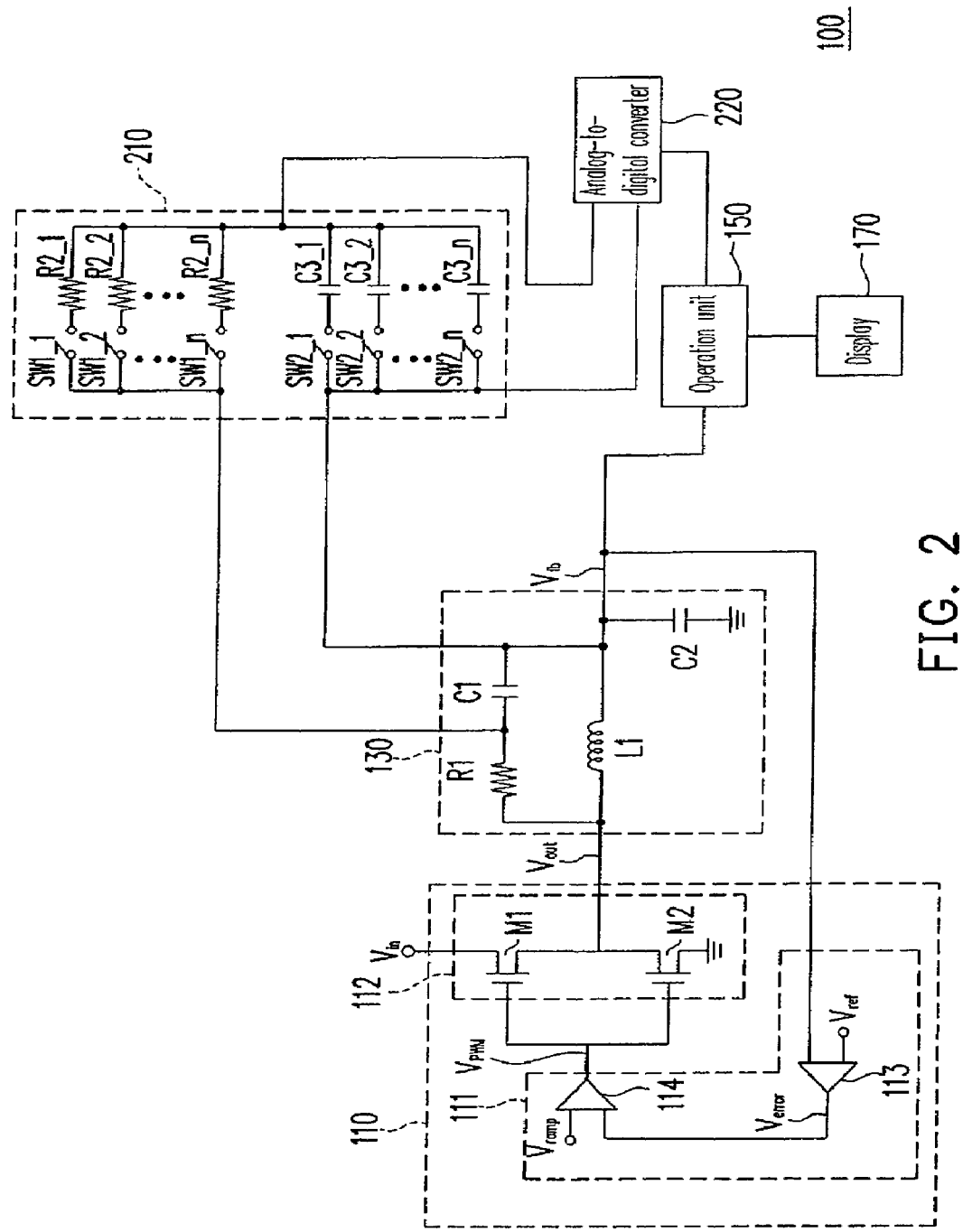
FIG. 2 is a circuit diagram of a power measuring apparatus according to another embodiment of the present invention.

FIG. 2 is a circuit diagram of a power measuring apparatus according to another embodiment of the present invention. Referring to FIG. 2, in the power measuring apparatus 100, the voltage transformer 110, the voltage-current measuring circuit 130 and the display 170 have the same architectures and functions as that of FIG. 1, so that they are omitted to describe. The difference of the present embodiment from that described with reference to FIG. 1 rests in the power measuring apparatus 100 which further includes a measuring module 210 and an ADC 220. The measuring module 210 is coupled to the first and second terminals of the capacitor C1, so that the terminal current signal can be measured by measuring a voltage across the first terminal and the second terminal of the capacitor C1, wherein the measuring module 210 includes switches SW1_1-SW1_n and SW2_1-SW2_n, resistors R2_1-R2_n and capacitors C2_1-C2_n, wherein n is a positive integer greater than zero.

The first terminals of the switches SW1_1-SW1_n are coupled to the first terminal of the capacitor C1; the first terminals of the switches SW2_1-SW2_n are coupled to the second terminal of the capacitor C1; the first ends of the resistors R2_1-R2_n are respectively coupled to the second terminals of the switches SW1_1-SW1_n and the second ends of the resistors R2_1-R2_n are coupled to each other, wherein each of the resistors R2_1-R2_n has a different resistance; the first terminals of the capacitors C2_1-C2_n are respectively coupled to the second terminals of the switches SW2_1-SW2_n, the second terminals of the capacitors C2_1-C2_n are respectively coupled to the second ends of the resistors R2_1-R2_n, wherein each of the capacitors C2_1-C2_n has a different capacitance.

By turning on and off the switches SW1_1-SW1_n and SW2_1-SW2_n, the resistors R2_1-R2_n and the capacitors C2_1-C2_n have different combinations, so that the measuring module 210 is able to measure terminal current signals in different current ranges. For example, when the switches SW1_1-SW1_2 and SW2_1-SW2_n2 are turned on, the resistors R2_1-R2_2 and the capacitors C2_1-C2_2 have a wiring combination to enable measuring a current range of max. 10 mA; if the switches SW1_3-SW1_5 and SW2_3-SW2_5 are turned on, the resistors R2_3-R2_5 and the capacitors C2_3-C5_n have a wiring combination to enable measuring a current range of max. 100 mA. Note that the above-mentioned depictions do not limit the present invention and a user can adjust the numbers of the switches, the resistors and the capacitors and the matching combinations thereof by the need for the specific measuring ranges.

Next, the terminal current signal generated by the capacitor C1 is converted into the digital current signal sent to the operation unit 150 by coupling the ADC 220 to the first terminals of the switches SW2_1-SW2_n and the second ends of the resistors R2_1-R2_n. In the embodiment, assuming the ADC 220 is an integer circuit (IC) of model IR3720 and the operation unit 150 is implemented by a BMC disposed on the motherboard of a computer, so that the analog signal received by the IC of model IR3720 is converted into a digital signal of an inter-integrated circuit ($I^2C$) and sent to the BMC for controlling and calculating the above-mentioned $I^2C$ digital signal.

Further, the BMC conducts an operation on the received voltage feedback signal $V_{fb}$ and the $I^2C$ digital signal to obtain the power signal. Finally, the display 170 is used to display the amount of the power signal.

In summary, the present invention uses a voltage-current measuring device to convert the output voltage signal generated by the voltage transformer into a voltage feedback signal; then, the voltage across the terminals of the first capacitor is measured to obtain the terminal current signal; after that, the operation unit is used to conduct an operation on the voltage feedback signal and the terminal current signal to obtain the power of a CPU or a chipset. In this way, in response to variations of the voltage feedback signal (output voltage signal) and the terminal current signal, the output of the operation unit has instantaneously changed outputs, which not only increases the accuracy of measuring the power, but also advances the operation efficiency and quality of thermal test.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power measuring apparatus, comprising:
  a voltage transformer, for converting an input voltage signal into an output voltage signal, comprising:
    a pulse width modulation unit, for generating a pulse width modulation signal according to a voltage reference signal and a voltage feedback signal; and
    a switch unit, coupled to the pulse width modulation unit for deciding whether or not to output the input voltage signal so as to generate the output voltage signal according to the pulse width modulation signal;
  a voltage-current measuring circuit, comprising:
    an inductor, having a first end for receiving the output voltage signal and a second end for generating the voltage feedback signal;
    a first resistor, having a first end coupled to the first end of the inductor;
    a first capacitor, having a first terminal coupled to a second end of the first resistor and a second terminal coupled to the second end of the inductor; and
    a second capacitor, having a first terminal coupled to the second end of the inductor and a second terminal coupled to a ground terminal; and
  an operation unit, for conducting an operation on the voltage feedback signal and a terminal current signal between the first terminal and the second terminal of the first capacitor so as to calculate a power, wherein the operation unit comprises:
    a current amplifier, having a first terminal and a second terminal respectively coupled to the first terminal and the second terminal of the first capacitor for converting the terminal current signal into a one-phase current signal;
    a voltage amplifier, having a first terminal for receiving the voltage feedback signal and a second terminal coupled to the ground terminal to gain the voltage feedback signal;
    a first analog-to-digital converter, for converting the one-phase current into a digital current signal;
    a first multiplier, for multiplying the digital current signal by a number and generating a total output current signal; and a second analog-to-digital converter, for converting the gained voltage feedback signal into a digital voltage signal; and a second multiplier, for multiplying the total output current signal by the digital voltage signal to obtain the power signal.

2. The power measuring apparatus according to claim 1, wherein the pulse width modulation unit comprises:

an error amplifier, for comparing the voltage feedback signal with a voltage reference signal and generating an error signal; and a comparator, for comparing the error signal with a ramp signal and generating the pulse width modulation signal.

3. The power measuring apparatus according to claim 1, wherein the switch unit comprises:

a first transistor, having a gate for receiving the pulse width modulation signal, a first source/drain terminal for receiving the input voltage signal and a second source/drain terminal for generating the output voltage signal; and a second transistor, having a gate for receiving the pulse width modulation signal, a first source/drain terminal coupled to the second source/drain terminal of the first transistor and a second source/drain terminal coupled to the ground terminal.

4. The power measuring apparatus according to claim 1, further comprising:

a measuring module, coupled to the first terminal and the second terminal of the first capacitor so as to measure a voltage across the first terminal and the second terminal of the first capacitor to obtain the terminal current signal, wherein the measuring module comprises:

a plurality of first switches, having first terminals coupled to the first terminal of the first capacitor;

a plurality of second switches, having first terminals coupled to the second terminal of the first capacitor;

a plurality of second resistors, having first ends respectively coupled to the second terminals of the first switches and second ends coupled to each other, wherein the second resistors have different resistances; and a plurality of third capacitors, having first terminals respectively coupled to the second terminals of the second switches and second terminals respectively coupled to the second ends of the second resistors, wherein the third capacitors have different capacitances; and a third analog-to-digital converter, coupled to the first terminals of the second switches and the second ends of the second resistors for converting the terminal current signal into a digital current signal, wherein on and off state of the first switches and second switches cause the second resistors and the third capacitors have different combinations so as to enable the measuring module to measure the terminal current signal in different current ranges.

5. The power measuring apparatus according to claim 4, wherein the operation unit is a baseboard management controller to conduct operations on the voltage feedback signal and the digital current signal for obtaining the power signal.

6. The power measuring apparatus according to claim 1, further comprising:

a display coupled to the output of the operation unit for displaying the amount of the power signal.

* * * * *